(12) United States Patent
Hu et al.

(10) Patent No.: US 9,082,657 B2
(45) Date of Patent: Jul. 14, 2015

(54) SEMICONDUCTOR STRUCTURE AND METHOD FOR MANUFACTURING THE SAME

(71) Applicants: Chih-Wei Hu, Toufen Township, Miaoli County (TW); Teng-Hao Yeh, Hsinchu (TW); Yen-Hao Shih, New Taipei (TW)

(72) Inventors: Chih-Wei Hu, Toufen Township, Miaoli County (TW); Teng-Hao Yeh, Hsinchu (TW); Yen-Hao Shih, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 105 days.

(21) Appl. No.: 13/676,672

(22) Filed: Nov. 14, 2012

(65) Prior Publication Data

US 2014/0131838 A1   May 15, 2014

(51) Int. Cl.
*H01L 21/3205*  (2006.01)
*H01L 27/115*  (2006.01)

(52) U.S. Cl.
CPC .... *H01L 27/11578* (2013.01); *H01L 27/11565* (2013.01)

(58) Field of Classification Search
None
See application file for complete search history.

(56) References Cited

U.S. PATENT DOCUMENTS 8,503,213 B2   8/2013   Chen et al.

FOREIGN PATENT DOCUMENTS

TW   201232554 A   8/2012

OTHER PUBLICATIONS

TW Office Action dated Aug. 22, 2014.

*Primary Examiner* — Marvin Payen
(74) *Attorney, Agent, or Firm* — McClure, Qualey & Rodack, LLP

(57) ABSTRACT

A semiconductor structure and a method for manufacturing the same are provided. The method comprises following steps. Semiconductor units are arranged on a substrate. A material layer is formed on the semiconductor units. A first patterned mask layer is formed on the semiconductor units. The first patterned mask layer has a mask opening corresponding to a portion of the semiconductor units and exposing the material layer. A portion of the material layer exposed by the mask opening is removed to remain a portion of the material layer on a sidewall of each of the semiconductor units exposed by the mask opening to form spacer structures.

19 Claims, 16 Drawing Sheets

US 9,082,657 B2

SEMICONDUCTOR STRUCTURE AND METHOD FOR MANUFACTURING THE SAME

BACKGROUND

1. Technical Field

The disclosure relates in general to a semiconductor structure and a method for manufacturing the same and more particularly to a 3D stack memory structure and a method for manufacturing the same.

2. Description of the Related Art

Memory devices are used in storage elements for many products such as MP3 players, digital cameras, computer files, etc. As the application increases, the demand for the memory device focuses on small size and large memory capacity. For satisfying the requirement, a memory having a high element density is need.

Designers have developed a method for improving a memory device density, using 3D stack memory device so as to increase a memory capacity and a cost per cell. However, the scaling limitation of a memory cell size of this kind of the memory device is still bigger than 50 nm. It is not easy to breakthrough the limitation. The performance of the memory device may also be limited due to its element material.

SUMMARY

A method for manufacturing a semiconductor structure is provided. The method comprises following steps. Semiconductor units are arranged on a substrate. A material layer is formed on the semiconductor units. A first patterned mask layer is formed on the semiconductor units. The first patterned mask layer has a mask opening corresponding to a portion of the semiconductor units and exposing the material layer. A portion of the material layer exposed by the mask opening is removed to remain a portion of the material layer on a sidewall of each of the semiconductor units exposed by the mask opening to form spacer structures.

A method for manufacturing a semiconductor structure is provided. The method comprises following steps. Semiconductor units are formed on a substrate and extending on a first region and a second region adjacent to each other. A material layer is formed on the semiconductor units. A patterned mask layer is formed on the semiconductor units. The patterned mask layer has a mask opening corresponding to the semiconductor units in the first region and exposing the material layer. A portion of the material layer exposed by the mask opening is removed to remain a portion of the material layer on sidewalls of all of the semiconductor units exposed by the mask opening to form spacer structures. The spacer structures on different of the semiconductor units are wholly separated from each other.

A semiconductor structure is provided. The semiconductor structure comprises a substrate, semiconductor units, and spacer structures. The semiconductor units are arranged on the substrate. The spacer structures are formed on sidewalls of whole the semiconductor units in a region. The spacer structures on different of the semiconductor units are wholly separated from each other.

The above and other aspects of the disclosure will become better understood with regard to the following detailed description of the non-limiting embodiment(s). The following description is made with reference to the accompanying drawings.

DETAILED DESCRIPTION

Figure 1A:
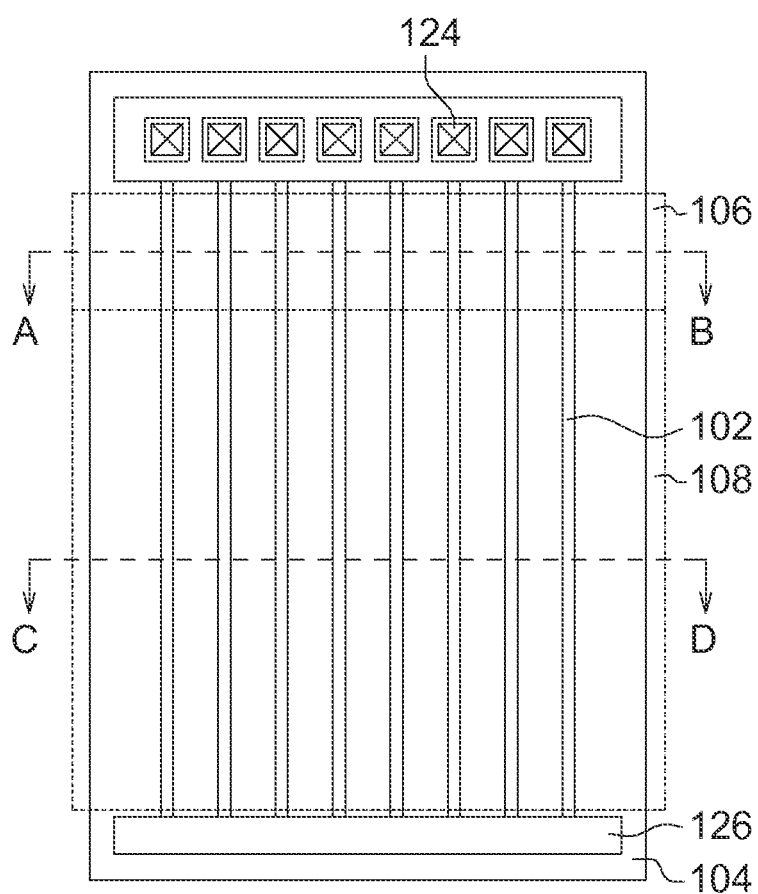
FIG. 1A~FIG. 9B illustrate a manufacturing process for a semiconductor structure according to one embodiment.

FIG. 1A~FIG. 9B illustrate a manufacturing process for a semiconductor structure according to one embodiment. Referring to FIG. 1A, semiconductor units 102 are arranged on a substrate 104. The semiconductor units 102 may be extended with bar shape in a first region 106 and a second region 108 adjacent to (or not overlapped with) each other. A cross-section view of the semiconductor structure drawn along AB line in the first region 106 and a cross-section view of the semiconductor structure drawn along CD line in the second region 108 may be shown in FIG. 1B for example.

Figure 1B:
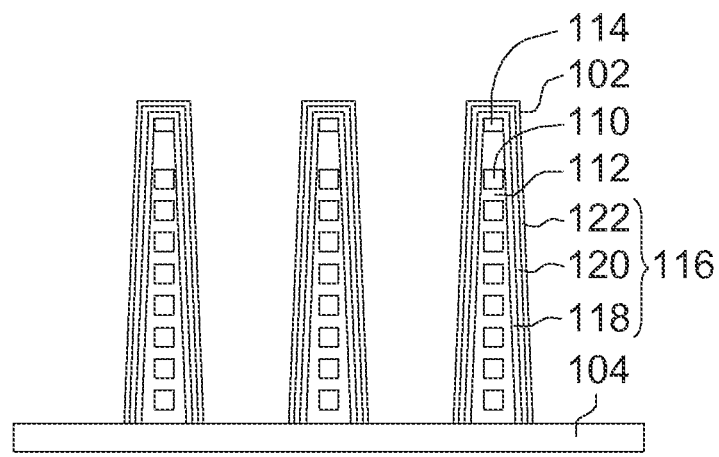

Referring to FIG. 1B, the semiconductor units 102 may comprise conductive strings 110 and dielectric strings 112 stacking on the substrate 104 alternately. A cap layer 114 may be formed on the most top one of the dielectric strings 112. The cap layer 114 may comprise a dielectric material. In one embodiment, for example, the cap layer 114 may comprise a nitride or an oxide, such as silicon nitride, silicon oxide, or other suitable materials. A dielectric structure 116 may be formed on the conductive strings 110, the dielectric strings 112 and the cap layer 114. For example, the dielectric structure 116 may comprise dielectric layers 118, 120, 122. In a case of the dielectric structure 116 being an ONO structure, the dielectric layers 118, 122 may be an oxide such as silicon oxide and the dielectric layer 120 may be a nitride such as silicon nitride. In other embodiments, the dielectric structure 116 may be a single layer of the dielectric layer comprising an oxide such as silicon oxide. The dielectric structure 116 may use other suitable film arrangement designs. The conductive strings 110 of the semiconductor units 102 may be electrically connected to bit line contacts 124 and a source line 126 (FIG. 1A).

Figure 2A:
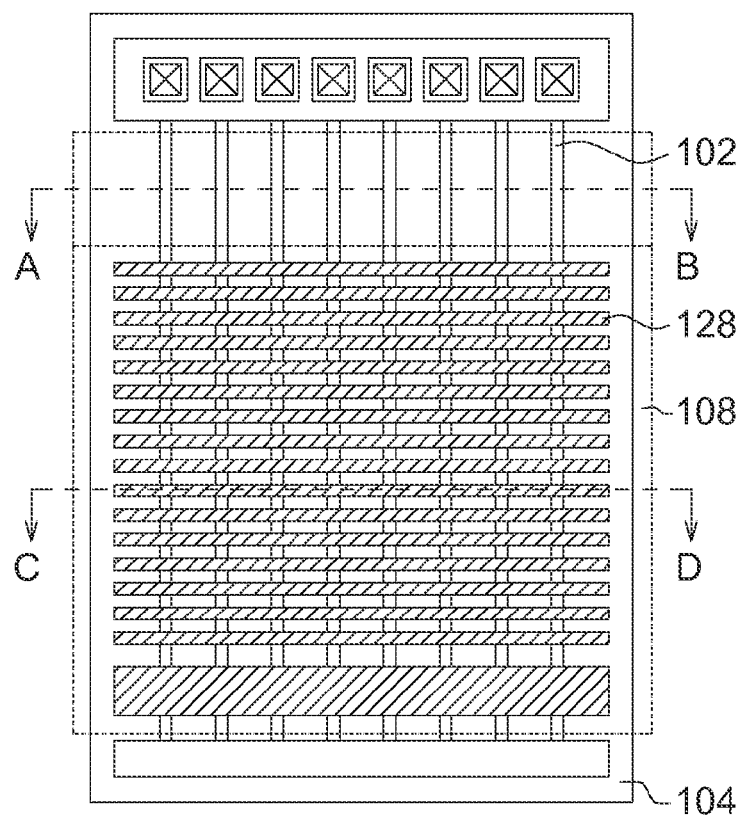

Referring to FIG. 2A, conductive layers 128 are arranged on the substrate 104 and the semiconductor units 102 on the second region 108. The semiconductor units 102 and the conductive layers 128 may be disposed in cross arrangement. In this step, a cross-section view of the semiconductor structure drawn along CD line in the second region 108 may be shown in FIG. 2B for example. The conductive layers 128 may comprise a metal, a polysilicon, a metal silicide such as SiW, or other suitable materials.

Figure 3A:
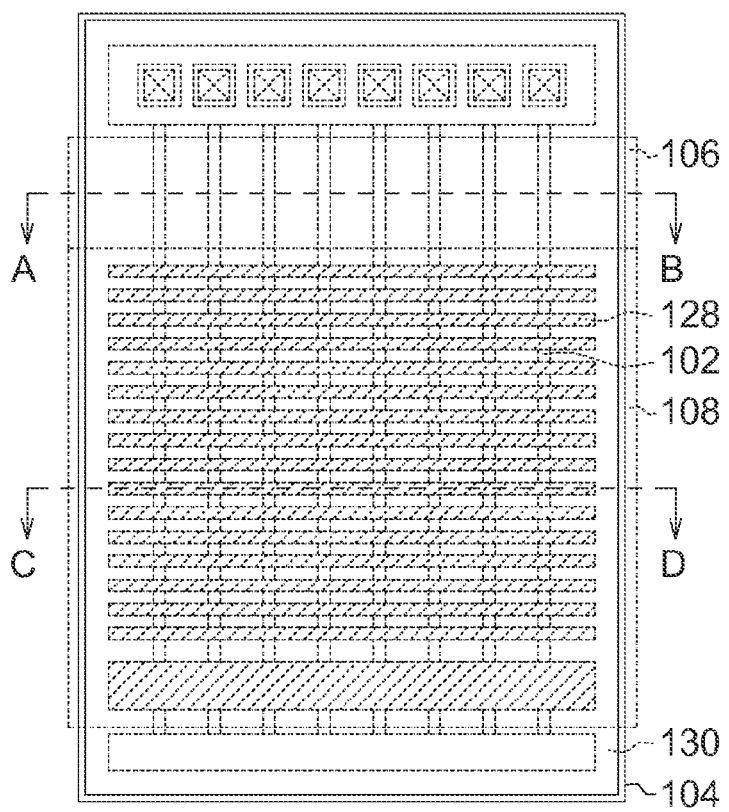
Figure 3B:
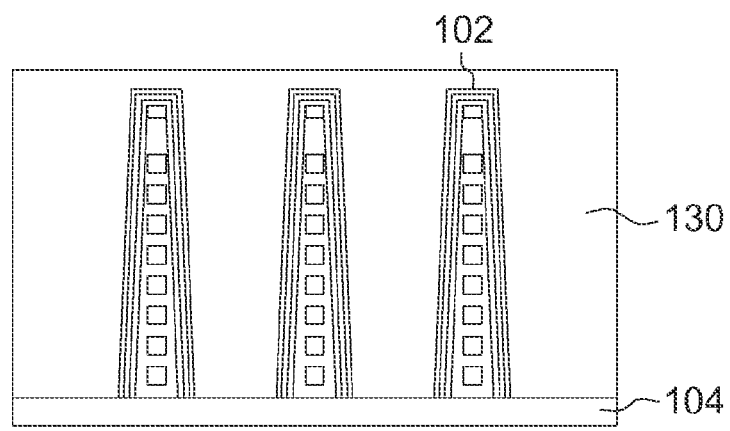

Referring to FIG. 3A, a mask layer 130 may be formed on the substrate 104, the semiconductor units 102 and the conductive layers 128 in the first region 106 and the second region 108. In this step, a cross-section view of the semiconductor structure drawn along AB line in the first region 106 may be shown in FIG. 3B, for example.

Figure 4A:
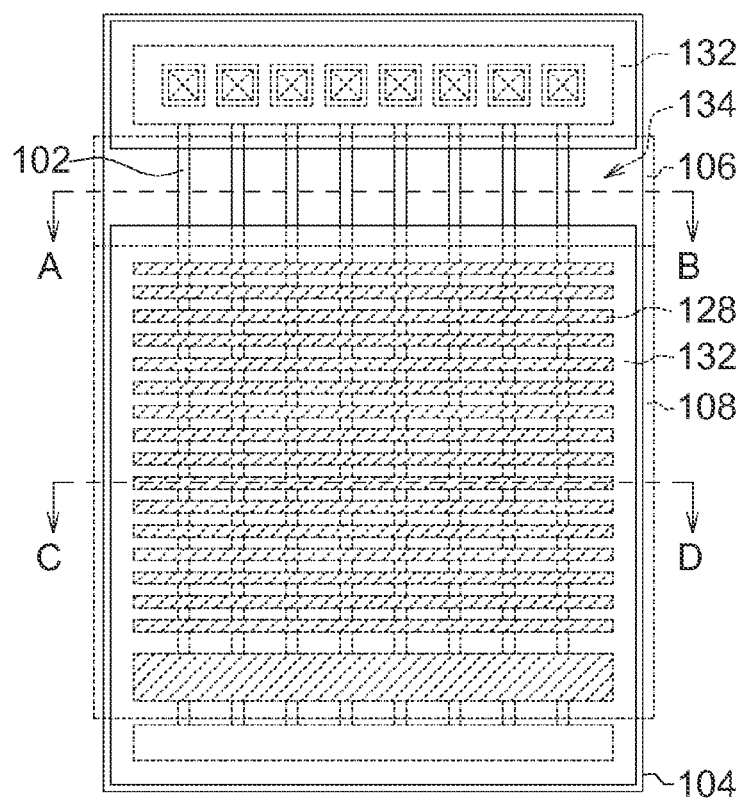
Figure 4B:
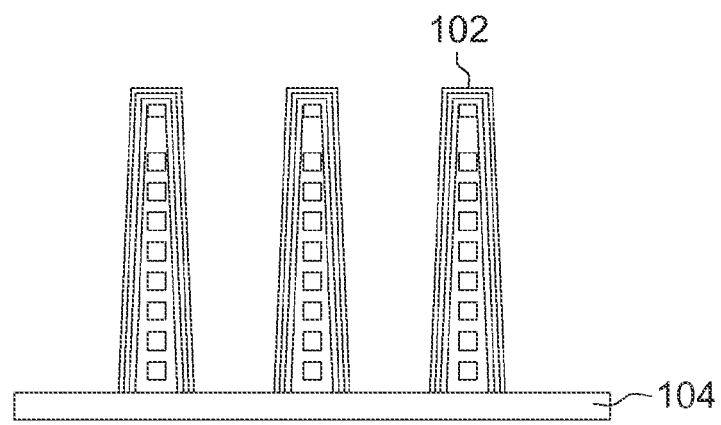

Referring to FIG. 4A, a patterned mask layer 132 is formed by removing a portion of the mask layer 130. The patterned mask layer 132 has a mask opening 134 corresponding to the first region 106 and exposing the semiconductor units 102 and the substrate 104 in the first region 106. The substrate 104, the semiconductor units 102 and the conductive layers 128 in the second region 108 are covered by the patterned mask layer 132. In this step, a cross-section view of the semiconductor structure drawn along AB line in the first region 106 may be shown in FIG. 4B, for example.

Figure 5A:
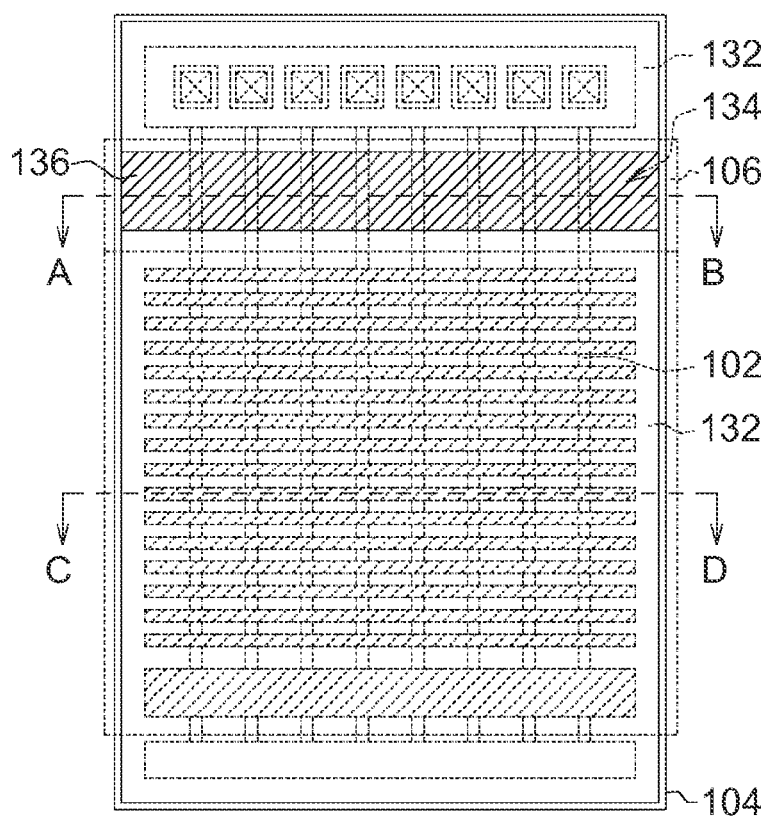
Figure 5B:
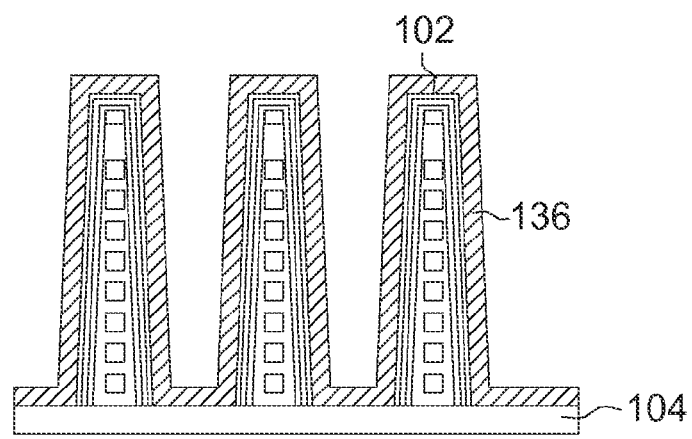

Referring to FIG. 5A, a material layer 136 is formed on the substrate 104 and the semiconductor units 102 exposed by the mask opening 134 of the patterned mask layer 132. In other words, the material layer 136 is exposed by the mask opening 134. In embodiments, the material layer 136 comprises a conductive material comprising a metal, a polysilicon, a metal silicide, or other suitable materials. In this step, a cross-section view of the semiconductor structure drawn along AB line in the first region 106 may be shown in FIG. 5B, for example.

Figure 6A:
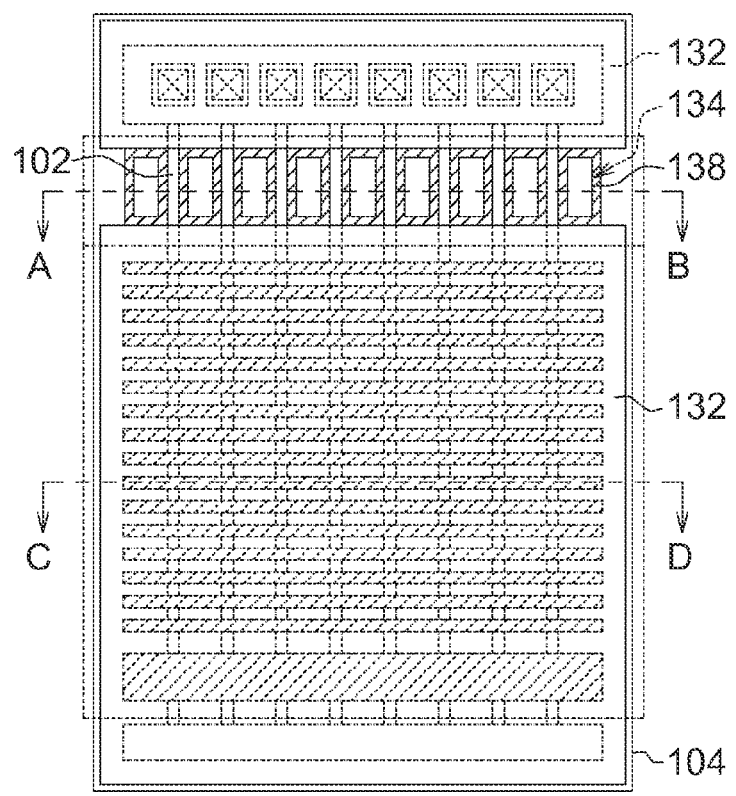
Figure 6B:
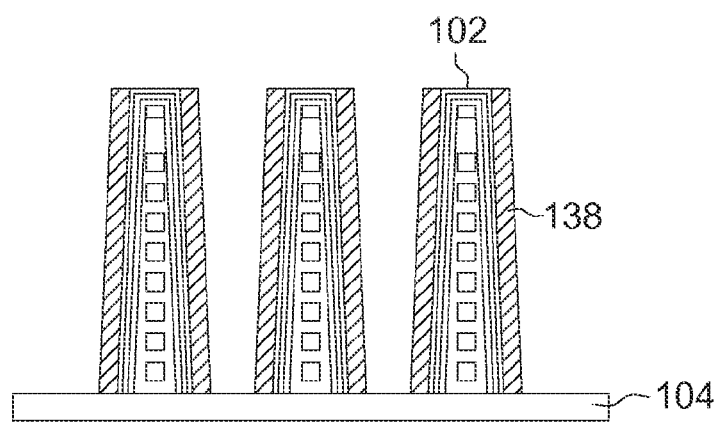

Referring to FIG. 6A, a portion of the material layer 136 exposed by the mask opening 134 is removed, remaining a material layer 138 on sidewalls of the semiconductor units 102 exposed by the mask opening 134 and corresponding to sidewalls of the mask opening 134. Referring to FIG. 6B, which is drawn along AB line in FIG. 6A, in other words, in this step, the removed portion of the material layer 136 is the portions on the substrate 104 between the two adjacent semiconductor units 102 and on upper surfaces of the semiconductor units 102. In embodiments, the remained material layer 138 has a ring shape as shown in FIG. 6A. This removing step may comprise an etching step using the patterned mask layer 132 as an etching mask. In embodiments, an anisotropic etching method may be used to remove the material layer 136 to form the material layer 138 as shown in FIG. 6A and FIG. 6B.

Figure 7A:
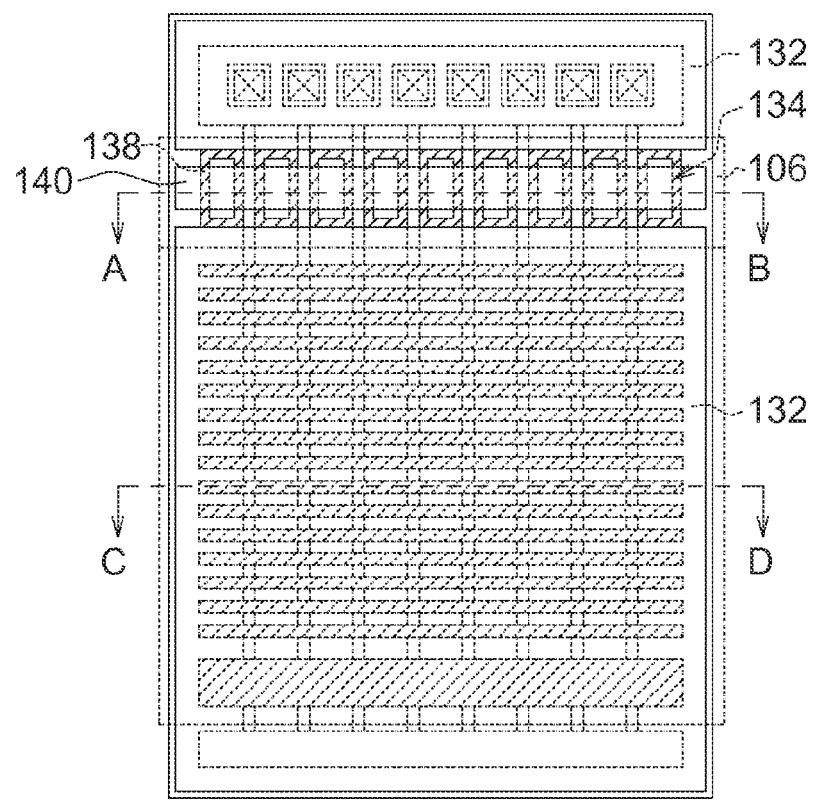
Figure 7B:
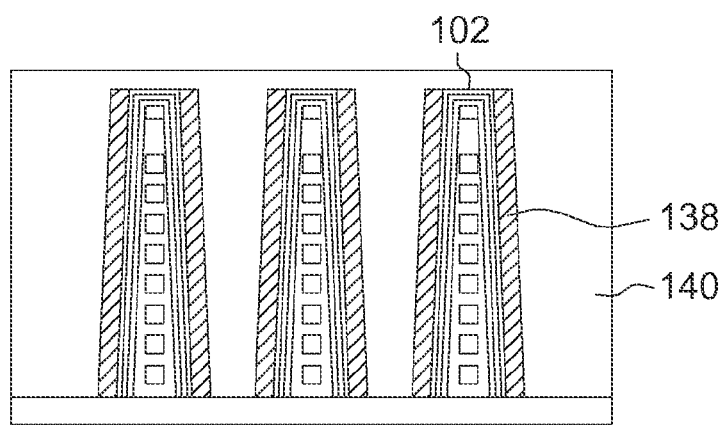

Referring to FIG. 7A, a patterned mask layer 140 is formed on the material layer 138 and the semiconductor units 102 exposed by the mask opening 134 of the patterned mask layer 132. In this step, a cross-section view of the semiconductor structure drawn along AB line in the first region 106 may be shown in FIG. 7B, for example.

Figure 8A:
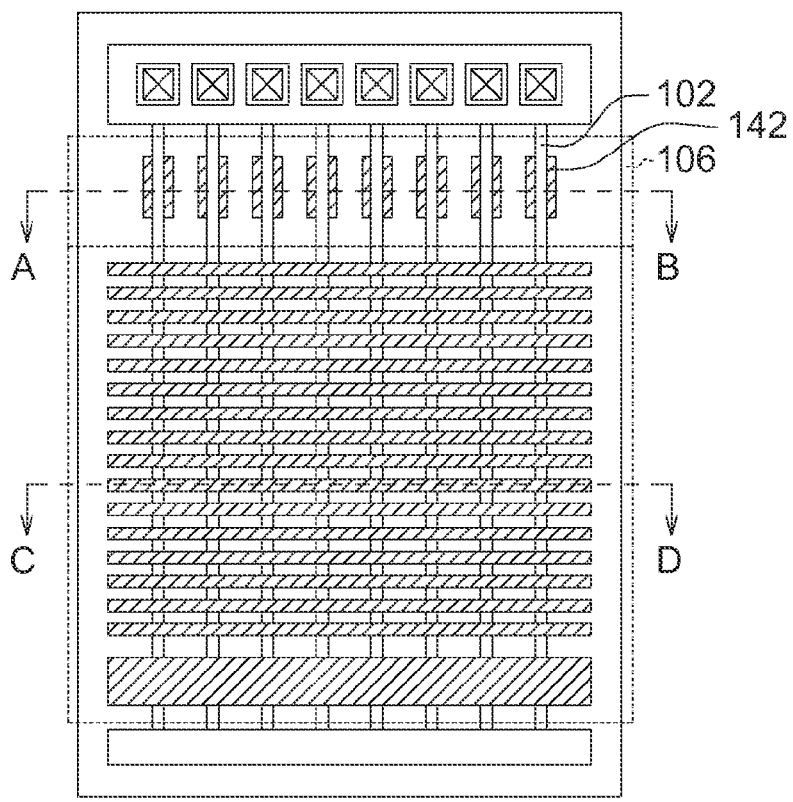
Figure 8B:
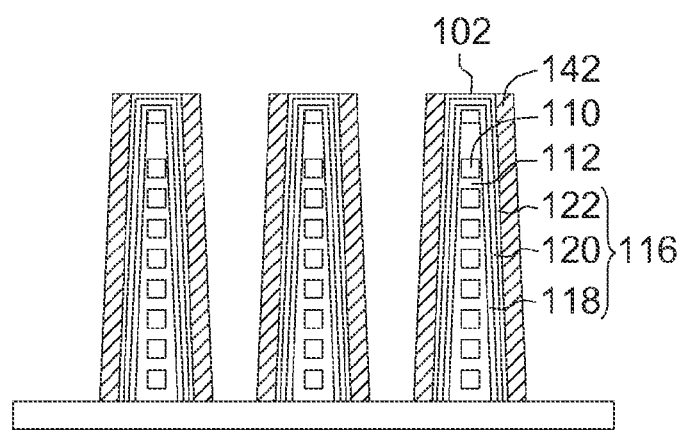

Referring to FIG. 8A, a portion of the material layer 138 not covered by the patterned mask layer 140 is removed to remain a material layer that forms spacer structures 142. Next, the patterned mask layer 132 and the patterned mask layer 140 are removed. In this step, a cross-section view of the semiconductor structure drawn along AB line in the first region 106 may be shown in FIG. 8B, for example. The spacer structures 142 are on the opposing two sidewalls of each of the semiconductor units 102 in the first region 106. In other words, the spacer structures 142 are on the dielectric structures 116 on the two opposing sidewalls of the conductive strings 110 and the dielectric strings 112 in the first region 106. The spacer structures 142 respectively on the two opposing sidewalls of the same the semiconductor unit 102 are separated from each other. Moreover, the spacer structures 142 on the different semiconductor units 102 are separated from each other.

Figure 9A:
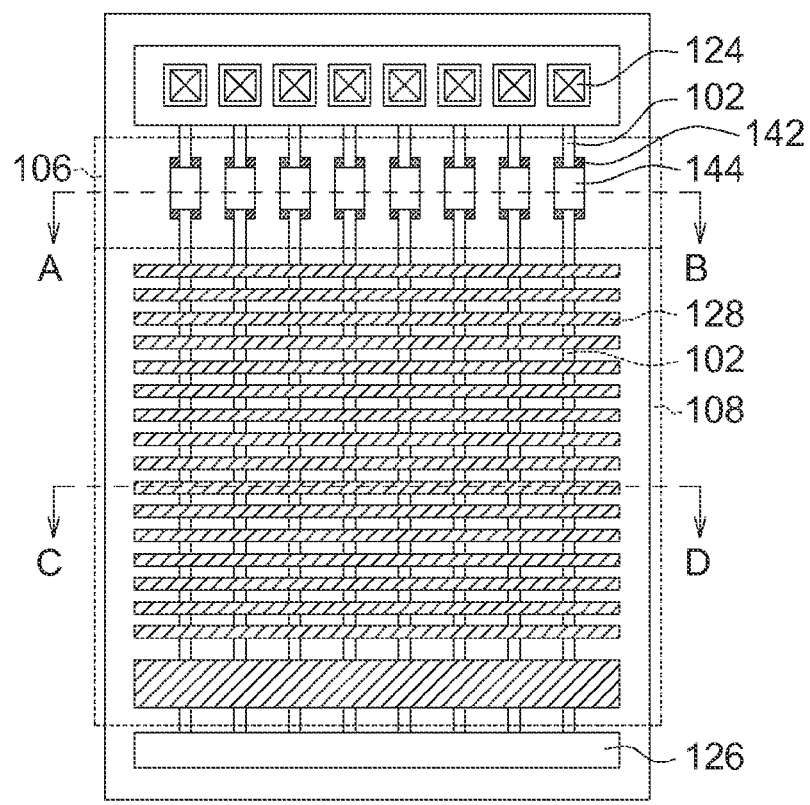
Figure 9B:
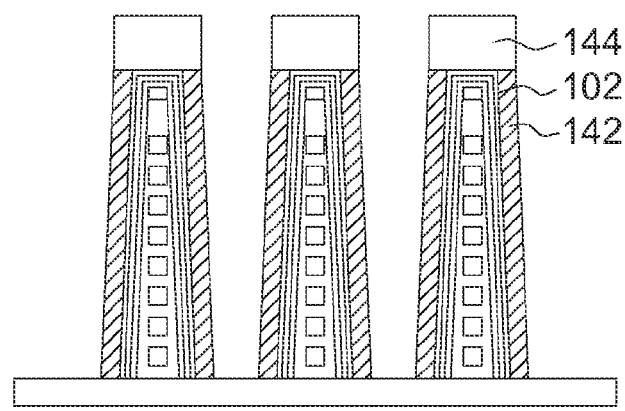

Referring to FIG. 9A and FIG. 9B, contact structures 144 are formed on the spacer structures 142 and the semiconductor units 102. The contact structures 144 may comprise a conductive material, for example, comprising a metal such as Au, Ag, Cu, etc., or other suitable materials.

Although embodiments are illustrated by a 3D vertical gate NAND flash memory, the present disclosure is not limited thereto. The concepts according to embodiments can also be applied to other kinds of devices.

In embodiments, for example, the conductive strings 110 separated by the dielectric strings 112 are used as bit lines. One of the conductive layers 128 in the second region 108, which is the most close to the source line 126, may be used as GSL, others of conductive layers 128 are used as WL. The spacer structures 142 in the first region 106 may be used as gate such as SSL. The semiconductor units 102 and the spacer structures 142 on the sidewalls of the semiconductor units 102 in the first region 106 may be regarded as string select transistor. The string select transistor may be controlled to be turned off to turn off the unselected NAND string page or to be turned on to turn on the selected NAND string page by adjusting voltages applied to the spacer structures 142.

Figure 22:
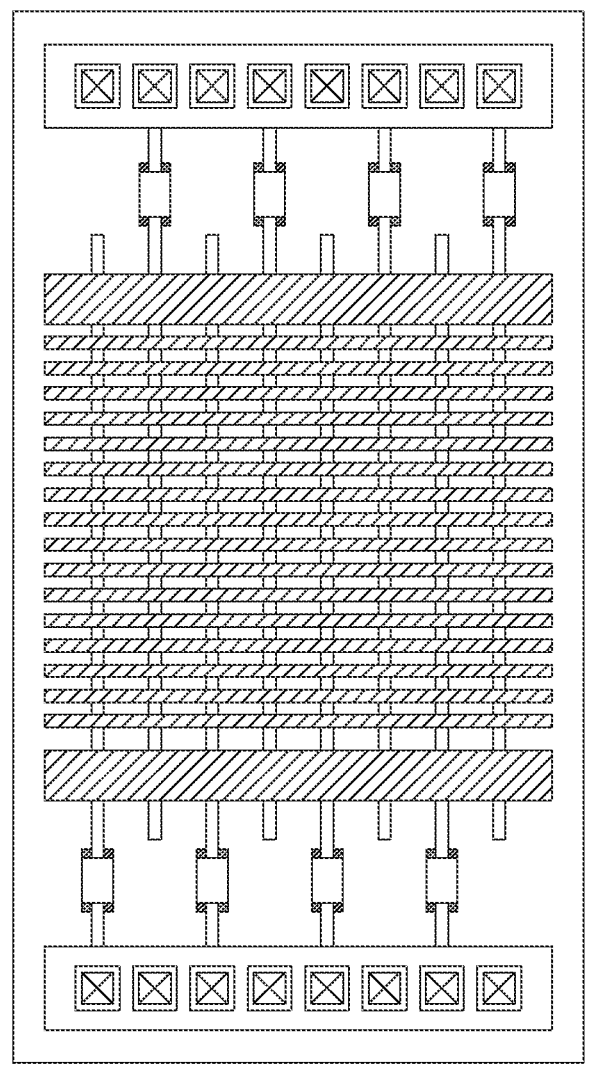
FIG. 22 illustrates a top view of the semiconductor structure according to one comparative example.

In embodiments, the spacer structures 142 are self aligned on the sidewalls of the semiconductor units 102. Therefore, the spacer structures 142 can be formed precisely without limitation due to critical features of lithography. Moreover, the manufacturing process is simple and has low cost. According to manufacturing methods in embodiments, even a gap space between the semiconductor units 102 is very narrow and/or an aspect ratio of the gap space is very huge, it is possible to form the spacer structures 142 on the different semiconductor units 102 to be separated from each other, i.e. to be not contact with each other or to be electrically insulated from each other precisely. Therefore, the spacer structures 142 may be formed on the same side of the all the semiconductor units 102, such as in the first region 106 (as shown in FIG. 9A) adjacent to the bit line contacts 124, without limited to forming on the opposing sides of the semiconductor units 102 with stagger arrangement as shown in FIG. 22 due to the critical feature of lithography. As shown in FIG. 22, the gap space between the string select transistors is twice as big as the gap space between the semiconductor units 102. Thus, according to embodiments, the flash memory array can have high unit array density, high operating efficiency, and high product yield.

FIG. 10~FIG. 15 illustrate a manufacturing process of the semiconductor structure according to another embodiment.

Figure 10:
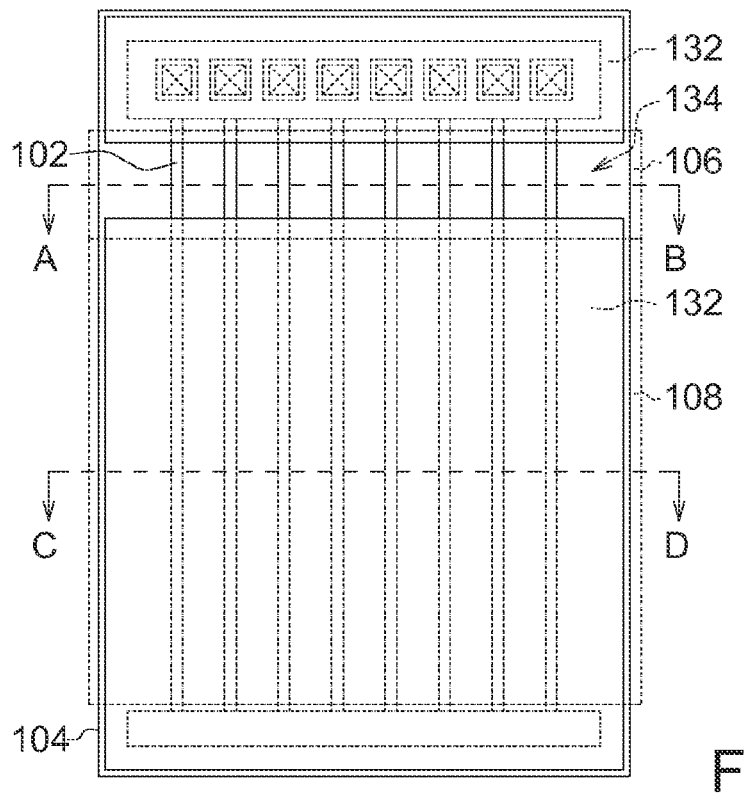
FIG. 10~FIG. 15 illustrate a manufacturing process of the semiconductor structure according to one embodiment.

Referring to FIG. 10, the patterned mask layer 132 is formed on the structure as shown in FIG. 1A. The patterned mask layer 132 has the mask opening 134 corresponding to the first region 106 and exposing the semiconductor units 102 and the substrate 104 in the first region 106. The substrate 104 and the semiconductor units 102 in the second region 108 are covered by the patterned mask layer 132. In this step, a cross-section view of the semiconductor structure drawn along AB line in the first region 106 may be shown in FIG. 4B, for example.

Figure 11:
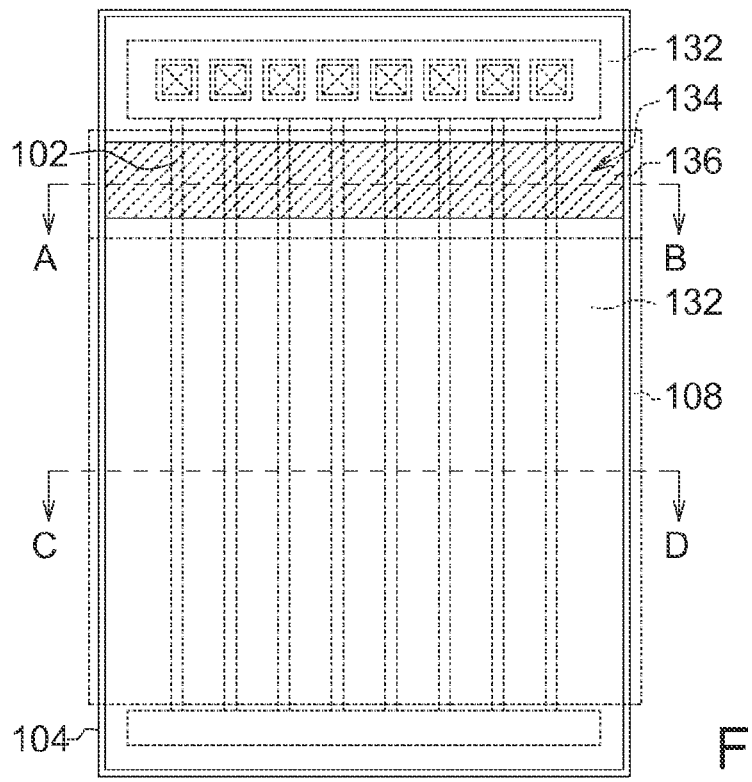

Referring to FIG. 11, the material layer 136 is formed on the substrate 104 and the semiconductor units 102 exposed by the mask opening 134 of the patterned mask layer 132. In other words, the material layer 136 is exposed by the mask opening 134. In embodiments, the material layer 136 comprises a conductive material comprising a metal, a polysilicon, a metal silicide, or other suitable materials. In this step, a cross-section view of the semiconductor structure drawn along AB line in the first region 106 may be shown in FIG. 5B, for example.

Figure 12:
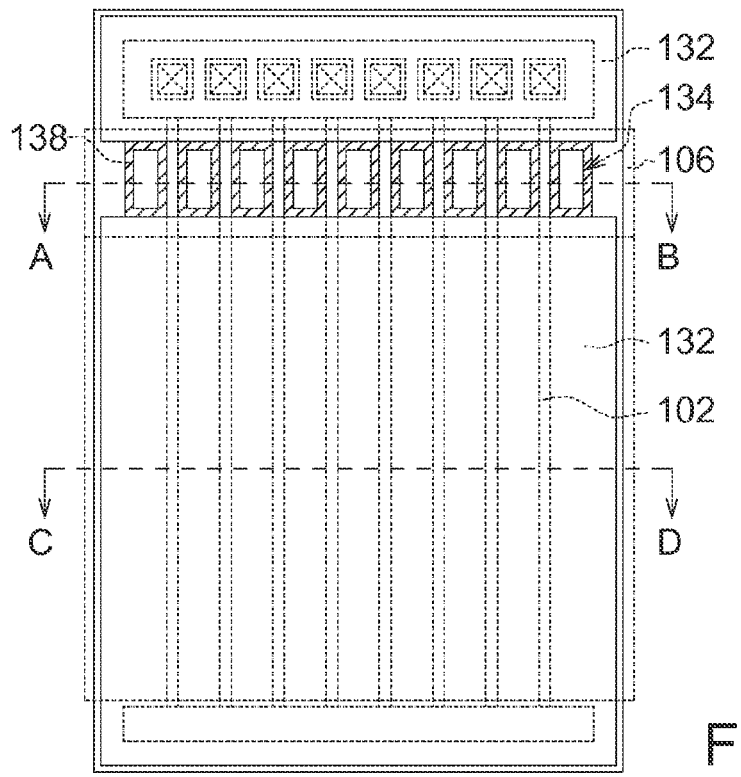

Referring to FIG. 12, a portion of the material layer 136 exposed by the mask opening 134 is removed, remaining the material layer 138 on sidewalls of the semiconductor units 102 exposed by the mask opening 134 and corresponding to sidewalls of the mask opening 134. In embodiments, the remained the material layer 138 has a ring shape. This removing step may comprise an etching step using the patterned mask layer 132 as an etching mask. In embodiments, an anisotropic etching method may be used to remove the material layer 136 to form the material layer 138. In this step, a cross-section view of the semiconductor structure drawn along AB line in the first region 106 may be similar with FIG. 6B, for example.

Figure 13:
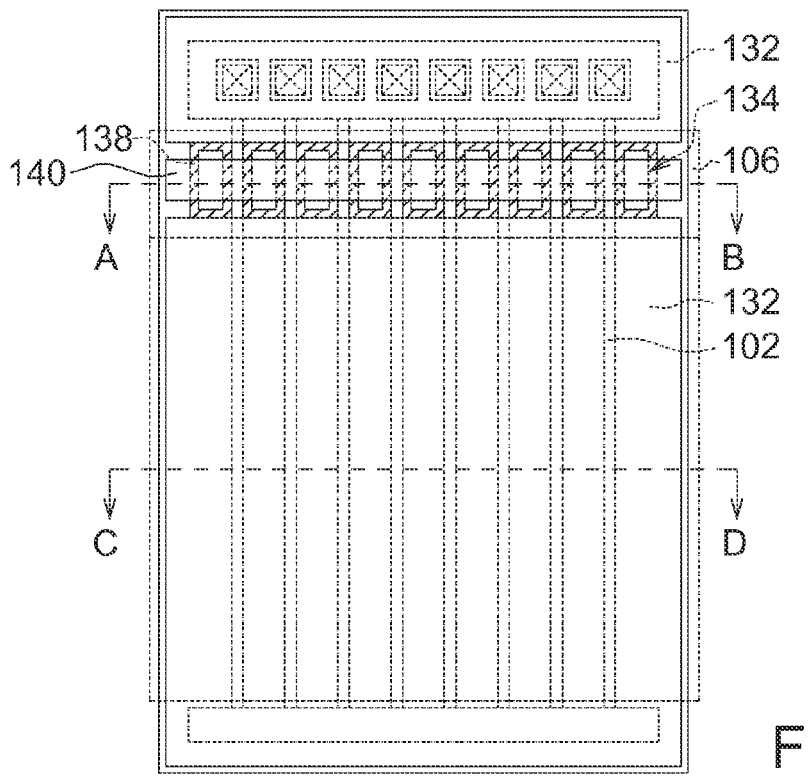

Referring to FIG. 13, the patterned mask layer 140 is formed on the material layer 138 and the semiconductor units 102 exposed by the mask opening 134 of the patterned mask layer 132. In this step, a cross-section view of the semiconductor structure drawn along AB line in the first region 106 may be similar with FIG. 7B, for example.

Figure 14:
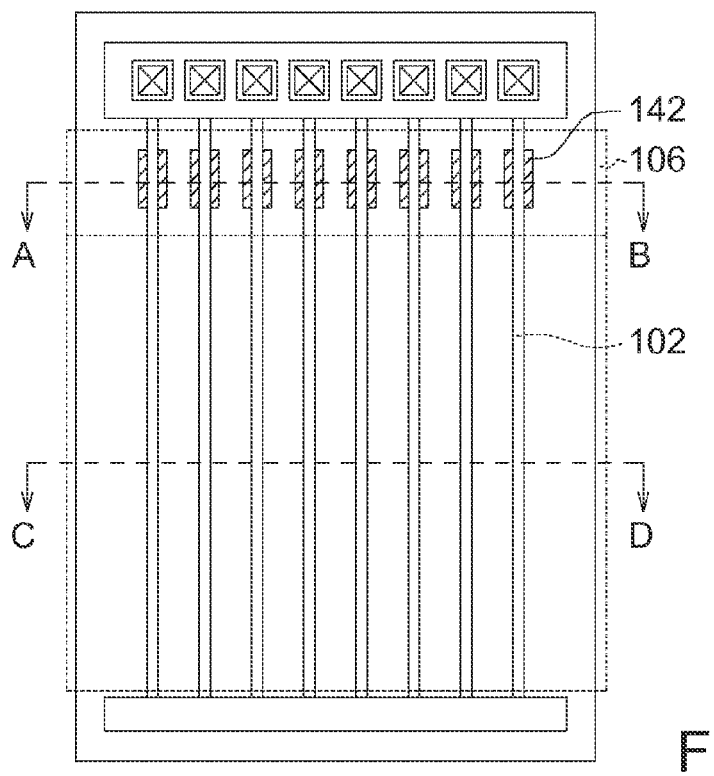

Referring to FIG. 14, a portion of the material layer 138 not covered by the patterned mask layers 132, 140 is removed to remain a material layer that forms spacer structures 142. Next, the patterned mask layer 132 and the patterned mask layer 140 are removed. The spacer structures 142 are on the opposing two sidewalls of each of the semiconductor units 102 in the first region 106. The spacer structures 142 respectively on the two opposing sidewalls of the same the semiconductor unit 102 are separated from each other. Moreover, the spacer structures 142 on the different semiconductor units 102 are separated from each other. In this step, a cross-section view of the semiconductor structure drawn along AB line in the first region 106 may be similar with FIG. 8B, for example.

Figure 15:
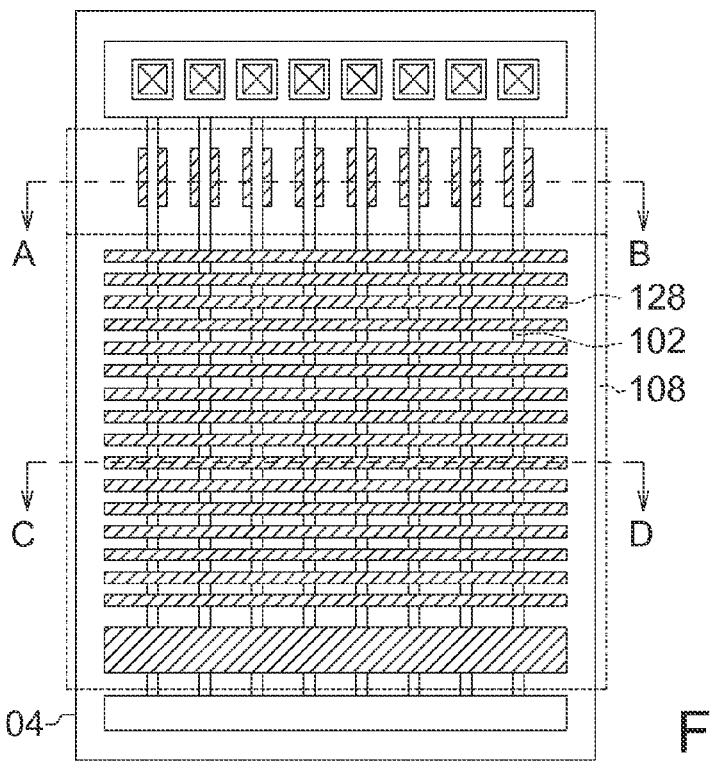

Referring to FIG. 15, next, the conductive layers 128 are arranged on the substrate 104 and the semiconductor units 102 in the second region 108. The semiconductor units 102 and the conductive layers 128 may be disposed in cross arrangement. The conductive layers 128 may comprise a metal, a polysilicon, a metal silicide such as WSi, or other suitable materials.

In embodiments, the spacer structures 142 are self aligned on the sidewalls of the semiconductor units 102. Therefore, the spacer structures 142 can be formed precisely without limitation due to critical features of lithography. Moreover, the manufacturing process is simple and has low cost. According to manufacturing methods in embodiments, even a gap space between the semiconductor units 102 is very narrow and/or an aspect ratio of the gap space is very huge, it is possible to form the spacer structures 142 on the different semiconductor units 102 to be separated from each other precisely. Thus, according to embodiments, the flash memory array can have high unit array density, high operating efficiency, and high product yield.

Figure 16:
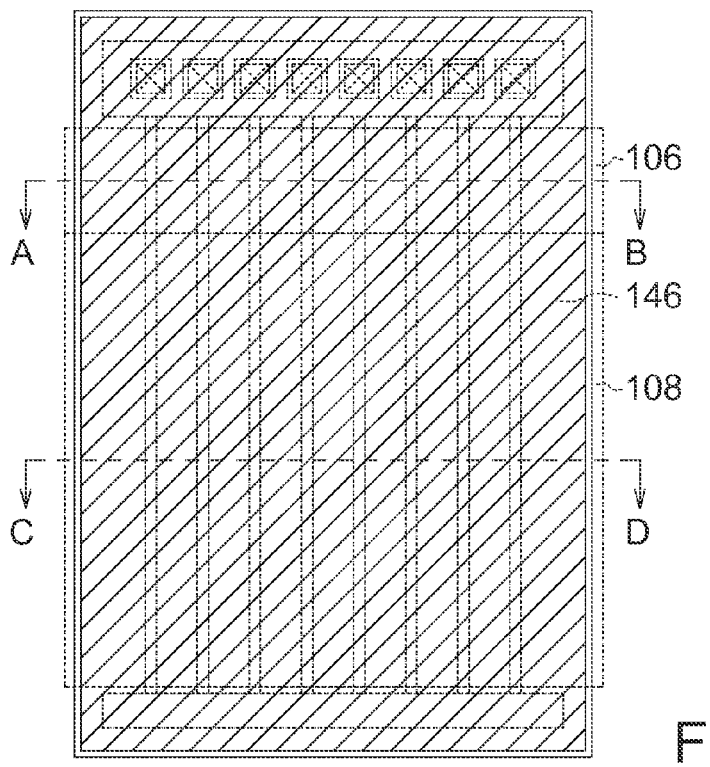
FIG. 16~FIG. 18 illustrate a manufacturing process of the semiconductor structure according to one embodiment.
Figure 17:
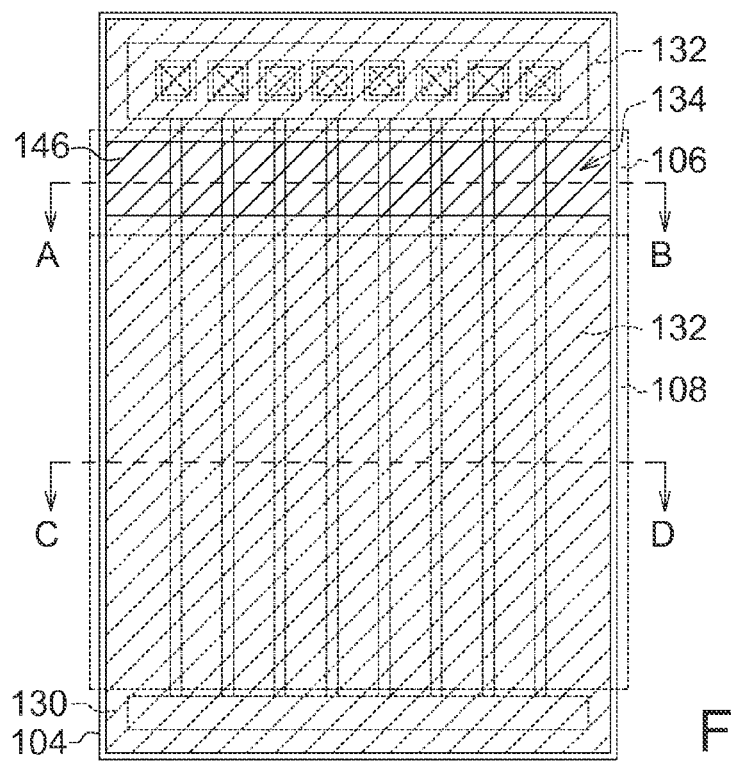
Figure 18:
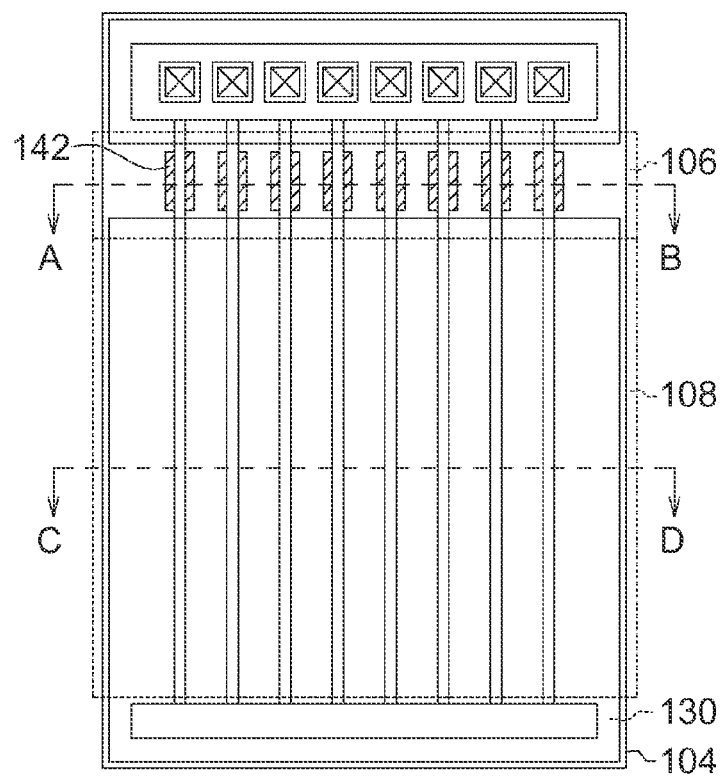

FIG. 16~FIG. 18 illustrate a manufacturing process of a semiconductor structure according to yet another embodiment.

Referring to FIG. 16, a material layer 146 is formed on the structure as shown in FIG. 1A. In this step, a cross-section views of the semiconductor structure drawn along AB line in the first region 106 and along CD line in the second region 108 may be similar with FIG. 5B, for example.

Referring to FIG. 17, the patterned mask layer 132 is formed on the structure as shown in FIG. 16. The patterned mask layer 132 has the mask opening 134 corresponding to the first region 106 and exposing the material layer 146 in the first region 106. The material layer 146 in the second region 108 is covered by the patterned mask layer 132. In this step, cross-section views of the semiconductor structure drawn along AB line in the first region 106 and along CD line in the second region 108 may be similar with FIG. 5B, for example.

Referring to FIG. 18, the spacer structures 142 are formed by removing a portion of the material layer 146. This step may use the concepts according to illustrations in FIG. 6A, FIG. 7A and FIG. 8A, or illustrations in FIG. 12, FIG. 13 and FIG. 14, thus is not illustrated in detail herein. In this step, a cross-section view of the semiconductor structure drawn along AB line in the first region 106 may be similar with FIG. 8B, for example. After the spacer structures are formed, the patterned mask layers 132, 140 may be removed to expose the material layer 146 under the patterned mask layers 132, 140. Next, a portion of the remained material layer 146 may be removed to form the conductive layers 128 arranged in the second region 108 as shown in FIG. 8A. Next, the contact structures 144 may be formed on the spacer structures 142 and the semiconductor units 102 so as to form the structure as shown in FIG. 9A, FIG. 9B.

In embodiments, the spacer structures 142 are self aligned on the sidewalls of the semiconductor units 102. Therefore, the spacer structures 142 can be formed precisely without limitation due to critical features of lithography. Moreover, the manufacturing process is simple and has low cost. According to manufacturing methods in embodiments, even a gap space between the semiconductor units 102 is very narrow and/or an aspect ratio of the gap space is very huge, it is possible to form the spacer structures 142 on the different semiconductor units 102 to be separated from each other precisely. Thus, according to embodiments, the flash memory array can have high unit array density, high operating efficiency, and high product yield.

In other embodiments, the semiconductor units 102 may have different structures in the first region 106 and the second region 108.

Figure 2B:
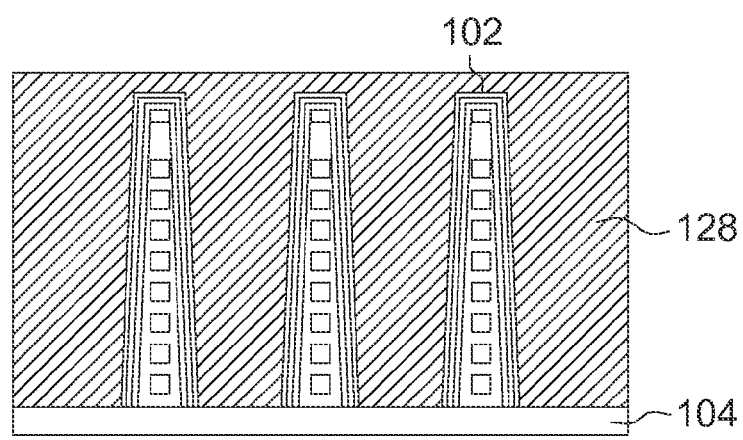
Figure 19:
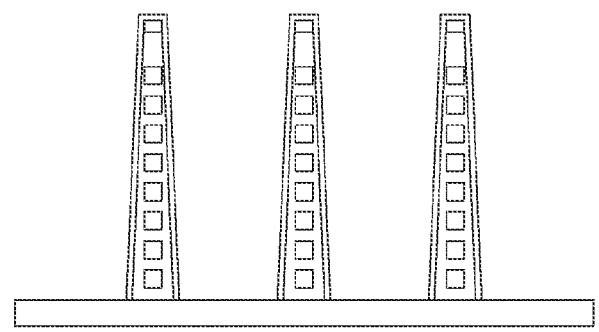
FIG. 19~FIG. 21 illustrate a manufacturing process of the semiconductor structure according to one embodiment.
Figure 20:
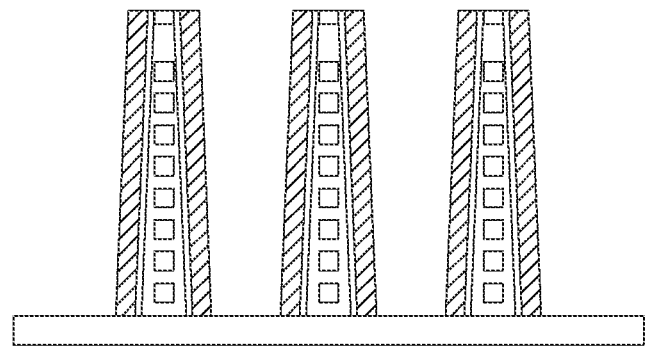
Figure 21:
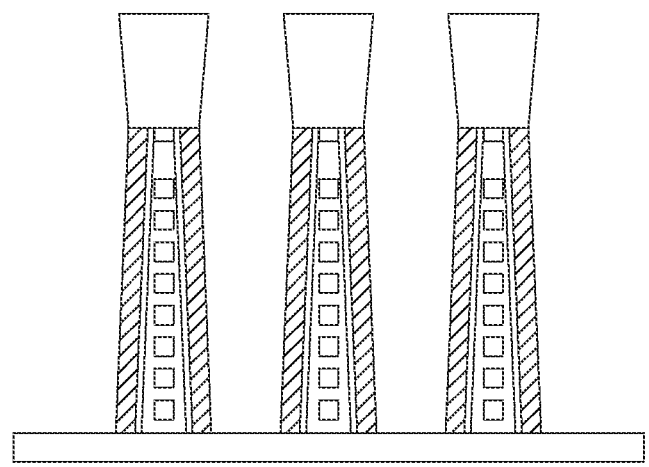

For example, the step for removing the mask layer 130 as illustrated in FIG. 4A, FIG. 10 may use the nitride dielectric layer 120 of the dielectric structure 116 as an etching stop layer, and the nitride dielectric layer 120 (i.e. a sacrificial layer) may be removed after removing the mask layer 130, so as to form the structure in the first region 106 as shown in FIG. 19 which is drawn along AB line in the first region 106, wherein the oxide dielectric layer 118 is exposed. Next, the subsequent process are continued to reach the step for removing the material layer 136 as illustrated with FIG. 6A, FIG. 12. In this step, the nitride or oxide cap layer 114 may be used as an etching stop layer, and thus the structure as shown in FIG. 20 (drawn along AB line in the first region 106) may be formed. In these embodiments, the finished semiconductor structure as shown in FIG. 21 (drawn along AB line in the first region 106 may be formed. In some embodiments, the semiconductor structure along CD line in the second region 108 may have the structure as shown in FIG. 2B. This concept can be applied to embodiments illustrated in FIG. 16~FIG. 18.

Although embodiments are illustrated by a 3D vertical gate NAND flash memory, the present disclosure is not limited thereto. The concepts according to embodiments can also be applied to other kinds of devices.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a semiconductor structure, comprising:
   forming semiconductor units arranged on a substrate;
   forming a material layer on the semiconductor units;
   forming a first patterned mask layer on the semiconductor units, wherein the first patterned mask layer has a mask opening corresponding to a portion of the semiconductor units and exposing the material layer; and
   removing a portion of the material layer exposed by the mask opening so as to remain a portion of the material layer on a sidewall of each of the semiconductor units exposed by the mask opening to form spacer structures.

2. The method for manufacturing the semiconductor structure according to claim 1, wherein the material layer and the spacer structures comprise a conductive material.

3. The method for manufacturing the semiconductor structure according to claim 1, wherein the semiconductor structure comprises a first region and a second region adjacent to each other, the each of the semiconductor units is extended on the first region and the second region, the mask opening of the first patterned mask layer is corresponded to the first region, the second region is covered by the first patterned mask layer.

4. The method for manufacturing the semiconductor structure according to claim 1, further comprising forming conductive layers arranged on the substrate and the semiconductor units, wherein the semiconductor units and the conductive layers are disposed in a cross arrangement.

5. The method for manufacturing the semiconductor structure according to claim 4, wherein the conductive layers are separated form the spacer structures.

6. The method for manufacturing the semiconductor structure according to claim 4, wherein the spacer structures are formed before the conductive layers.

7. The method for manufacturing the semiconductor structure according to claim 4, wherein the spacer structures are formed after the conductive layers are formed.

8. The method for manufacturing the semiconductor structure according to claim 4, wherein the semiconductor structure comprises a first region and a second region adjacent to each other, the spacer structures are formed in the first region, the conductive layers are formed in the second region.

9. The method for manufacturing the semiconductor structure according to claim 1, wherein the step for forming the semiconductor units, the step for forming the first patterned mask layer, the step for forming the material layer and the step for removing the material layer are performed in sequence.

10. The method for manufacturing the semiconductor structure according to claim 1, wherein the step for forming the semiconductor units, the step for forming the material layer, the step for forming the first patterned mask layer, and the step for removing the material layer are performed in sequence.

11. The method for manufacturing the semiconductor structure according to claim 1, wherein the step for removing the material layer comprises:
    removing a portion of the material layer on the substrate between two of the semiconductor units; and
    removing a portion of the material layer on an upper surface of the semiconductor units.

12. The method for manufacturing the semiconductor structure according to claim 1, wherein the spacer structures on the sidewalls of the different semiconductor units are separated from each other.

13. The method for manufacturing the semiconductor structure according to claim 1, further comprising:
    forming a second patterned mask layer on the spacer structures; and
    removing a portion of the material layer not covered by the second patterned mask layer.

14. The method for manufacturing the semiconductor structure according to claim 13, wherein a whole portion of the material layer not covered by the first patterned mask layer and the second patterned mask layer is removed.

15. The method for manufacturing the semiconductor structure according to claim 1, wherein the step for removing the material layer comprises performing an etching step using the first patterned mask layer as an etching mask layer to remove a portion of the material layer and remain a portion of the material layer corresponding to a sidewall of the mask opening and on the sidewalls of the semiconductor units.

16. The method for manufacturing the semiconductor structure according to claim 15, wherein the portion of the material layer corresponding to the sidewall of the mask opening and on the sidewalls of the semiconductor units has a ring shape.

17. The method for manufacturing the semiconductor structure according to claim 1, wherein the step for forming the semiconductor units comprises:
    forming conductive strings and dielectric strings stacking alternately on the substrate; and
    forming a dielectric structure on sidewalls of the conductive strings and the dielectric strings.

18. The method for manufacturing the semiconductor structure according to claim 17, wherein each of the spacer structures is formed on the dielectric structure.

19. A method for manufacturing a semiconductor structure, comprising:
    forming semiconductor units on a substrate and extending on a first region and a second region adjacent to each other;
    forming a material layer on the semiconductor units;
    forming a patterned mask layer on the semiconductor units, wherein the patterned mask layer has a mask opening corresponding to the semiconductor units in the first region and exposing the material layer; and
    removing a portion of the material layer exposed by the mask opening so as to remain a portion of the material layer on sidewalls of all of the semiconductor units exposed by the mask opening to form spacer structures, wherein the spacer structures on different of the semiconductor units are wholly separated from each other.

\* \* \* \* \*